(12) United States Patent
Hong

(10) Patent No.: US 10,833,065 B2
(45) Date of Patent: Nov. 10, 2020

(54) ARRAY SUBSTRATE AND DISPLAY PANEL

(71) Applicant: Wuhan China Star Optoelectronics Technology Co., Ltd., Wuhan (CN)

(72) Inventor: Guanghui Hong, Shenzhen (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 15/740,239

(22) PCT Filed: Oct. 21, 2017

(86) PCT No.: PCT/CN2017/107176
§ 371 (c)(1),
(2) Date: Aug. 23, 2018

(87) PCT Pub. No.: WO2019/056446
PCT Pub. Date: Mar. 28, 2019

(65) Prior Publication Data
US 2019/0386001 A1    Dec. 19, 2019

(30) Foreign Application Priority Data

Sep. 19, 2017 (CN) .......................... 2017 1 0847460

(51) Int. Cl.
*H01L 27/02* (2006.01)
*G02F 1/1362* (2006.01)
*H01L 27/12* (2006.01)

(52) U.S. Cl.
CPC .... *H01L 27/0292* (2013.01); *G02F 1/136204* (2013.01); *G02F 1/136286* (2013.01); *H01L 27/124* (2013.01); *G02F 2202/22* (2013.01)

(58) Field of Classification Search
CPC .............. H01L 27/0292; H01L 27/124; G02F 1/136286; G02F 1/136204
USPC ........................................................ 257/355
See application file for complete search history.

(56) References Cited

U.S. PATENT DOCUMENTS

| 2014/0092082 A1* | 4/2014 | Choi | G09G 3/3696 345/213 |
| 2015/0221272 A1* | 8/2015 | Xu | G09G 3/36 345/211 |
| 2015/0339999 A1* | 11/2015 | Zheng | G11C 19/28 345/92 |

(Continued)

FOREIGN PATENT DOCUMENTS

CN    107065339 A    8/2017

*Primary Examiner* — Igwe U Anya
(74) *Attorney, Agent, or Firm* — Brinks Gilson & Lione

(57) ABSTRACT

An array substrate and a display panel are disclosed. The array substrate includes: a GOA unit; a plurality of gate lines, electrically connected to the GOA unit; and a static-conducting device, electrically connected between the plurality of gate lines, in such a way that the plurality of gate lines are electrically connected to each other. In the array substrate, the static-conducting device is arranged between the plurality of gate lines, in such a way that the plurality of gate lines are electrically connected to each other to together resist the ESD. In this way, the anti-electrostatic discharge ability of the array substrate is improved, and the product quality is also improved.

20 Claims, 4 Drawing Sheets

(56) References Cited

U.S. PATENT DOCUMENTS

| | | | |
|---|---|---|---|
| 2016/0123817 A1* | 5/2016 | Bennett | G01K 7/16 |
| | | | 345/156 |
| 2017/0160607 A1* | 6/2017 | Zhao | G02F 1/1362 |
| 2018/0108649 A1* | 4/2018 | Cheng | G02F 1/136204 |
| 2018/0182341 A1* | 6/2018 | Imajo | G09G 3/20 |

* cited by examiner

ARRAY SUBSTRATE AND DISPLAY PANEL

CROSS-REFERENCE TO RELATED APPLICATIONS

The present application is a 35 U.S.C. § 371 National Phase conversion of International (PCT) Patent Application No. PCT/CN2017/107176 filed Oct. 21, 2017, which claims foreign priority to Chinese Patent Application No. 201710847460.1, filed on Sep. 19, 2017 in the State Intellectual Property Office of China, the entire contents of which are hereby incorporated by reference.

TECHNICAL FIELD

The present disclosure relates to the display technology, and more particular, to an array substrate and a display panel.

BACKGROUND

In manufacturing processes of display panels, electrostatic charges may be accumulated in the display panels due to some external factors, such as continuous technical operations and transport, or the changes of the environment, or the like. Since the glass is a kind of insulation material, the electrostatic charges may always stay on surfaces of substrates, unless suitable discharging channels are provided. When electrostatic charges are accumulated over a certain level, electrostatic discharge (ESD) may occur.

The electrostatic discharge may last for a very short time, and plenty of charges may be transferred in the short time in such a way that a high current may be generated. Thus, the high current may break down semiconductor elements, or generate sufficient heat to melt the semiconductor elements. This may result in degradation or scrapping of parts of electronic components imperceptibly, which brings great loss to the economic. Therefore, the electrostatic discharge may do deadly harms to the electronic products. In specific, the electrostatic discharge may not only make the reliability of the products reduced, but also make the maintenance cost increased. Every year, the electrostatic discharge may bring billions of dollars to the electronic manufacturing industry.

GOA (Gate Driver on Array) technology is a driving method using thin film transistor (TFT) liquid crystal display array process to form a gate-scan driving circuit in the thin film transistor array substrate in order to scan gate lines one by one. When using the GOA technology, the manufacturing cost may be reduced, and narrow-frame design of the display panels may be achieved. Therefore, the GOA technology may be applied to various displays.

A GOA circuit may have two basic functions. On one hand, the GOA circuit may output gate scan driving signals, drive the gate lines in the panel and open the TFTs in a display area, in order to charge pixels. On the other hand, the GOA circuit has a function of shift register, that is, after an output of one gate scan driving signal is completed, the GOA circuit controls to output a next gate scan driving signal by means of a clock, and so on, thus the outputs of the gate scan driving signals are performed successively. The GOA technology may reduce a bonding process of an external IC, and probably improve the capacity and reduce the product cost. Besides, the liquid display panel may be more suitable for manufacturing the display products having narrow frame by means of GOA technology.

In the conventional array substrate, no anti-static unit is provided, and a routing layer of the gate lines will be easily attracted to the circuit. Once a row of gate line generates electrostatic charges, the electrostatic charges cannot be discharged, and thus pixels in the display area or the GOA circuit may be broken down, thereby affecting normal functions of the panel at last, and in turn reducing the yield of the products.

Therefore, it is necessary to provide an improved array substrate and a display panel.

SUMMARY

The technical problem the present disclosure intended to solve is to provide an array substrate and a display panel, in which a static-conductive device is provided to conduct a plurality of gate lines to resist together the electrostatic discharge, and improve the anti-electrostatic discharge ability of the array substrate.

In order to solve the technical problem above, a technical solution is adopted in the present application. Wherein an array substrate is provided, which comprises: a GOA (Gate Driver On Array) unit; a plurality of gate lines, electrically connected to the GOA unit; and a static-conducting device, electrically connected among the plurality of gate lines, in such a way that the plurality of gate lines are electrically connected to each other; wherein the array substrate comprises a non-display area; the GOA unit and the static-conducting device are both located in the non-display area; the GOA unit comprises a plurality of GOA subunits; and the plurality of gate lines are electrically connected to the plurality of GOA subunits one to one.

In order to solve the technical problem above, another technical solution is adopted in the present application. Wherein an array substrate is provided, which comprises: a GOA (Gate Driver On Array) unit; a plurality of gate lines, electrically connected to the GOA unit; and a static-conducting device, electrically connected among the plurality of gate lines, in such a way that the plurality of gate lines are electrically connected to each other.

In order to solve the technical problem above, in a further aspect, a further technical solution is adopted in the present application. Wherein a display panel is provided, which comprises the array substrate described above.

The present disclosure may have the following advantages: compared with the prior art, the static-conducting device is arranged among the plurality of gate lines, in such a way that the plurality of gate lines are electrically connected to each other to together resist the ESD. In this way, it is possible improve the anti-electrostatic discharge ability of the array substrate, and in turn improve the product quality.

DETAILED DESCRIPTION

Figure 1:
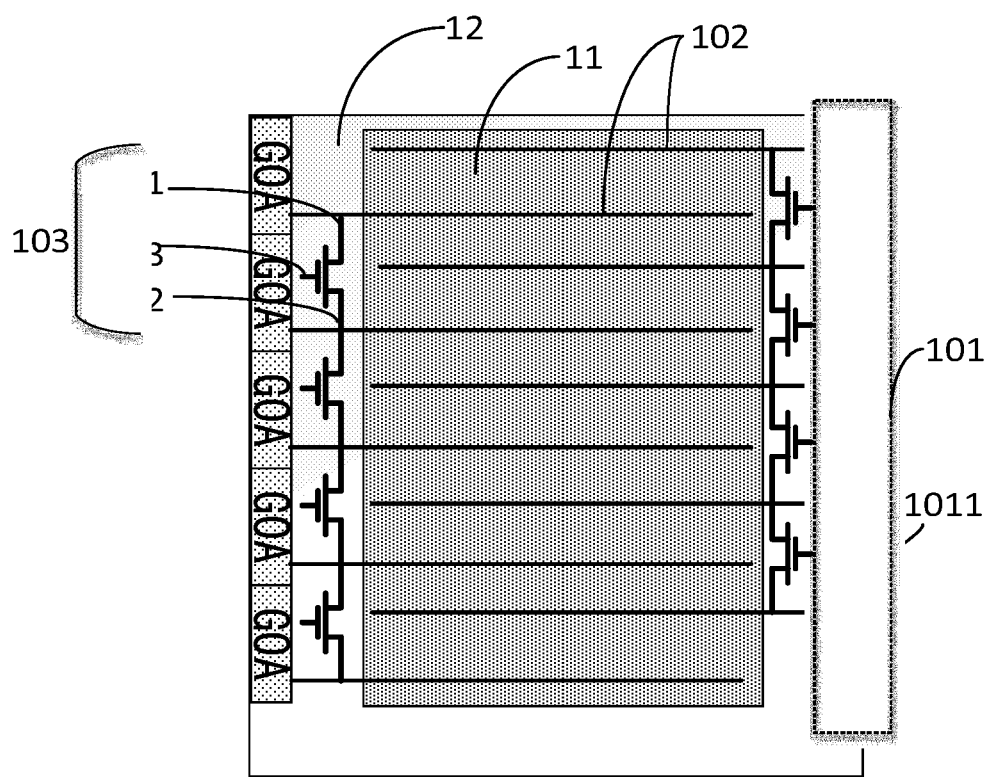
FIG. 1 is a structural view of an array substrate according to a first embodiment of the present disclosure.

Referring to FIG. 1, a structural view of an array substrate according to a first embodiment of the present disclosure is depicted in FIG. 1.

As shown in FIG. 1, the array substrate may be divided into a display area 11 and a non-display area 12. In specific, the array substrate may include a GOA unit (Gate Driver On Array) 101, a plurality of gate lines 102, and a static-conducting device. Furthermore, the GOA unit 101 may include a plurality of GOA subunits 1011, and the plurality of gate lines 102 may be electrically connected to the plurality of GOA subunits 1011 one to one. The static-conducting device may be connected among the plurality of gate lines 102, in such a way that the plurality of gate lines 102 may be electrically connected to each other via the static-conducting device. It should be noted that, in this embodiment, the GOA unit may be distributed at two sides of the array substrate. However, in other embodiment, it is also possible for only providing the GOA unit at one side of the array substrate, and the distribution of the GOA unit will not be further limited in the present disclosure.

In this embodiment, the static-conducting device may include a plurality of static-conducting units, and each of the static-conducting units is arranged between two gate lines. More specifically, each of the static-conducting units comprises a TFT 103. Each TFT 103 and the GOA unit 101 may be both located in the non-display area 12. The GOA unit 101 may include a plurality of GOA subunits 1011, a plurality of gate lines 102 may be provided, and the plurality of GOA subunits 1011 are electrically connected to the plurality of gate lines 102 one to one. Each TFT 103 may include a source electrode 1031, a drain electrode 1032 and a gate electrode 1033. The source electrode 1031 of each TFT may be connected to one gate line 102. The drain electrode 1032 of each TFT may be connected to another adjacent gate line 102. The gate electrode 1033 may be floated. During a normal operation, a resistance between the source electrode 1031 and the drain electrode 1032 of each TFT may be large, and thus it will not affect the normal operation of the panel. That is to say, during the normal operation, the TFT 103 will not affect electric potentials between two adjacent gate lines 102. However, once ESD occurs in at least one row of gate line 102, the TFT 103 may play roles of static conductors, in such a way that all the gate lines 102 on the whole panel may together resist the ESD, and thus the anti-electrostatic discharge ability of the array substrate may be improved.

In other embodiments, the two gate lines 102 connected to each TFT 103 may be two gate lines that are not adjacent to each other. It is also possible to provide at least two TFTs 103 between the two gate lines 102. That is, each of the static-conducting units may include at least two TFTs. The at least two TFTs 103 may be connected to each other in parallel or in serial, and the connection between the at least two TFTs will not be limited in the present disclosure. For example, it is possible to connect two TFTs 103 in serial, and then further arrange the two TFTs 103 connected in serial between the two gate lines 102. In another example, each of the static-conducting units may include three TFTs divided into two branches connected in parallel between the two gate lines 102; in one branch, two TFTs 103 are connected in parallel, and then further arranged between the two gate lines 102; in the other branch, a further TFT 103 is directly connected between two gate lines 102.

Compared with the prior art, the static-conducting device is arranged among the plurality of gate lines, in such a way that the plurality of gate lines are electrically connected to each other to together resist the ESD. In this way, it is possible improve the anti-electrostatic discharge ability of the array substrate, and in turn improve the product quality.

Figure 2:
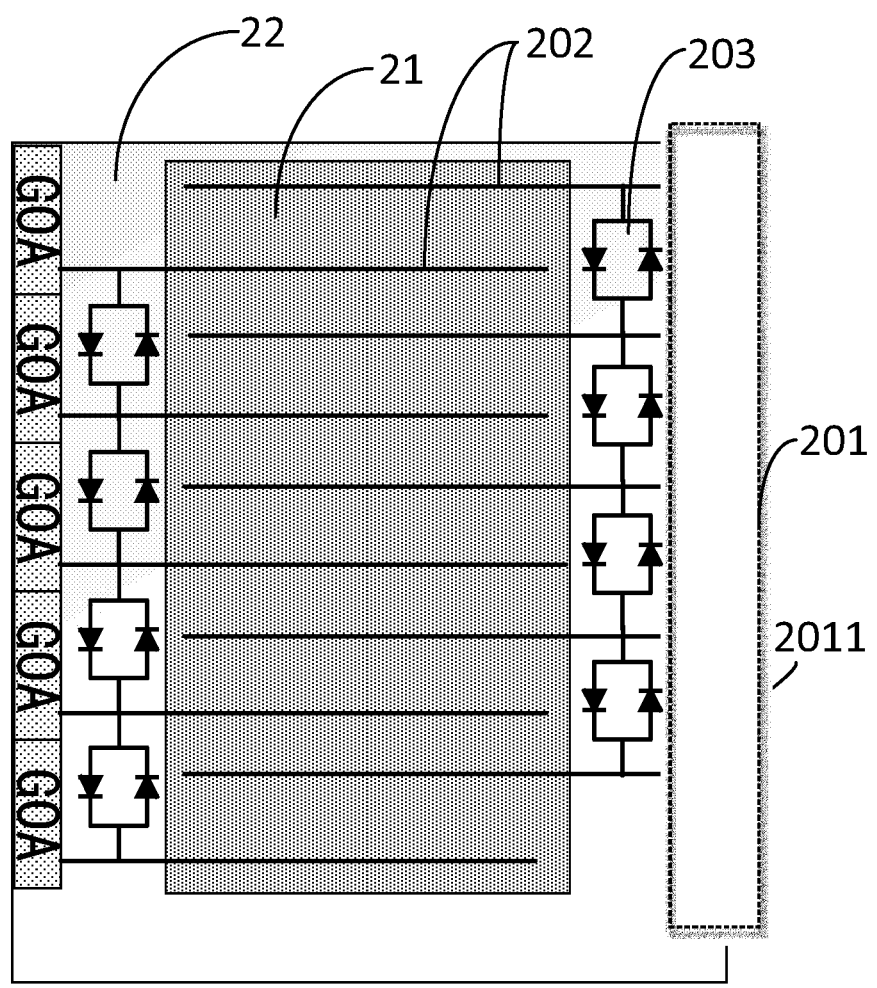
FIG. 2 is a structural view of an array substrate according to a second embodiment of the present disclosure.

Referring to FIG. 2, a structural view of an array substrate according to a second embodiment of the present disclosure is depicted in FIG. 2.

As shown in FIG. 2, the array substrate may be divided into a display area 21 and a non-display area 22. In specific, the array substrate may include a GOA unit 201, a plurality of gate lines 202, and a static-conducting device. Furthermore, the GOA unit 201 may include a plurality of GOA subunits 2011, and the plurality of gate lines 202 may be electrically connected to the plurality of GOA subunits 2011 one to one. The static-conducting device may be connected among the plurality of gate lines 202, in such a way that the plurality of gate lines 202 may be electrically connected to each other via the static-conducting device. It should be noted that, in this embodiment, the GOA unit may be distributed at two sides of the array substrate. However, in other embodiment, it is also possible for only providing the GOA unit at one side of the array substrate, and the distribution of the GOA unit will not be further limited in the present disclosure.

In this embodiment, the static-conducting device may include a plurality of static-conducting units, and each of the static-conducting units is arranged between two gate lines. More specifically, each of the static-conducting units comprises a diode ring 203. Each diode ring 203 and the GOA unit 201 may be both located in the non-display area 22. The GOA unit 201 may include a plurality of GOA subunits 2011, a plurality of gate lines 202 may be provided, and the plurality of GOA subunits 2011 are electrically connected to the plurality of gate lines 202 one to one. Each diode ring 203 may include two static-conducting paths configured for respectively conducting positive charges and negative charges. During a normal operation, a resistance of each diode ring 203 may be large, and thus it will not affect the normal operation of the panel. That is to say, during the normal operation, the diode ring 203 will not affect electric potentials between two adjacent gate lines 202. However, once the ESD occurs in at least one row of gate line 202, the diode ring 203 may play roles of static conductors, during which the positive charge static-conducting path may conduct positive charges, while the negative charge static-conducting path may conduct negative charges. In this way, all the gate lines 202 on the whole panel may together resist the ESD, and thus the anti-electrostatic discharge ability of the array substrate may be improved.

In other embodiments, the two gate lines 202 connected to each diode ring 203 may be two gate lines that are not adjacent to each other. It is also possible to provide at least two diode rings 203 between the two gate lines 102. That is, each of the static-conducting units may include at least two diode rings. The at least two diode rings 203 may be connected to each other in parallel or in serial, and the connection between the at least two rings will not be limited in the present disclosure. For example, it is possible to connect two diode rings 203 in serial, and further arrange the two diode rings 203 between the two gate lines 202. In another example, each of the static-conducting units may include three diode rings divided into two branches connected in parallel between the two gate lines 202; in one branch, two diode rings 203 are connected in parallel, and then further arranged between the two gate lines 202; in the other branch, a further diode ring 203 is directly connected between two gate lines 202.

Compared with the prior art, the static-conducting device is arranged among the plurality of gate lines, in such a way that the plurality of gate lines are electrically connected to each other to together resist the ESD. In this way, it is possible improve the anti-electrostatic discharge ability of the array substrate, and in turn improve the product quality.

Figure 3:
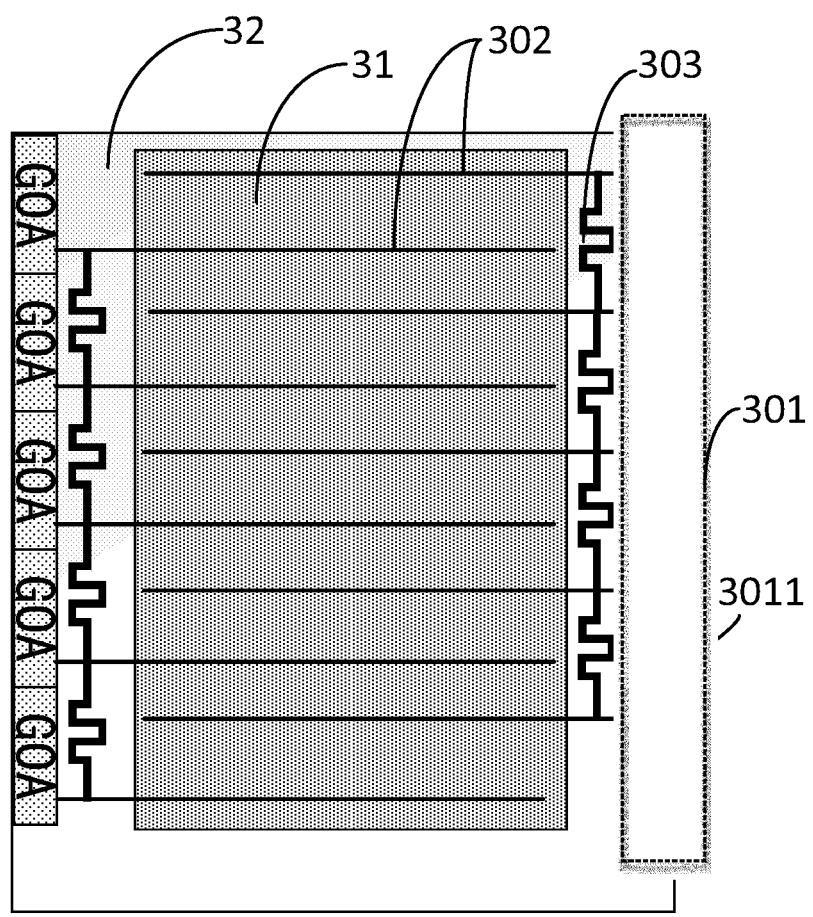
FIG. 3 is a structural view of an array substrate according to a third embodiment of the present disclosure.

Referring to FIG. 3, a structural view of an array substrate according to a third embodiment of the present disclosure is depicted in FIG. 3.

As shown in FIG. 3, the array substrate may be divided into a display area 31 and a non-display area 32. In specific, the array substrate may include a GOA unit 301, a plurality of gate lines 302, and a static-conducting device. Furthermore, the GOA unit 301 may include a plurality of GOA subunits 3011, and the plurality of gate lines 302 may be electrically connected to the plurality of GOA subunits 3011 one to one. The static-conducting device may be connected among the plurality of gate lines 202, in such a way that the plurality of gate lines 202 may be electrically connected to each other via the static-conducting device. It should be noted that, in this embodiment, the GOA unit may be distributed at two sides of the array substrate. However, in other embodiment, it is also possible for only providing the GOA unit at one side of the array substrate, and the distribution of the GOA unit will not be further limited in the present disclosure.

In this embodiment, the static-conducting device may include a plurality of static-conducting units, and each of the static-conducting units is arranged between two gate lines. More specifically, each of the static-conducting units comprises a poly resistor 303. Each poly resistor 303 and the GOA unit 301 may be both located in the non-display area 32. The GOA unit 301 may include a plurality of GOA subunits 3011, a plurality of gate lines 302 may be provided, and the plurality of GOA subunits 3011 are electrically connected to the plurality of gate lines 302 one to one. During a normal operation, a resistance of each poly resistor 303 may be large, and thus it will not affect the normal operation of the panel. That is to say, during the normal operation, the poly resistor 303 will not affect electric potentials between two adjacent gate lines 302. However, once ESD occurs in at least one row of gate line 302, the poly resistor 303 may play roles of static conductors, in such a way that all the gate lines 302 on the whole panel may together resist the ESD, and thus the anti-electrostatic discharge ability of the array substrate may be improved.

In other embodiments, the two gate lines 102 connected to the poly resistor 303 may be two gate lines that are not adjacent to each other. It is also possible to provide at least two poly resistors 303 between the two gate lines 102. That is, each of the static-conducting units may include at least two poly resistors. The at least two poly resistors 303 may be connected to each other in parallel or in serial, and the connection between the at least two poly resistors will not be limited in the present disclosure.

Figure 4:
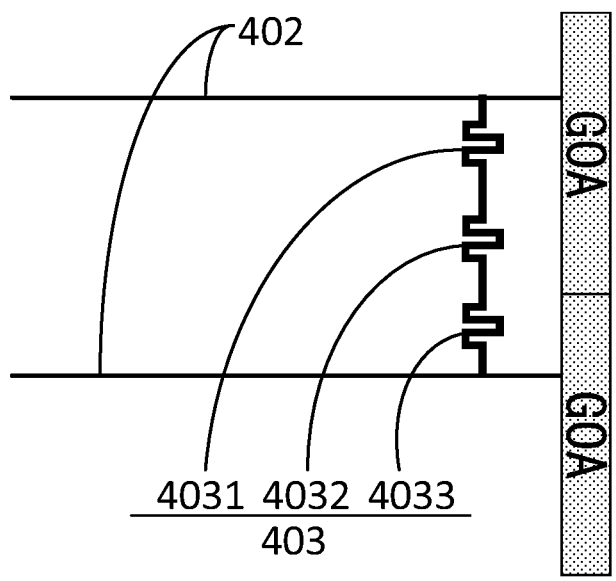
FIG. 4 is a partially structural view of an array substrate according to a fourth embodiment of the present disclosure.

Referring to FIG. 4, a partially structural view of an array substrate according to a fourth embodiment of the present disclosure is depicted in FIG. 4.

The structure of the array substrate in the fourth embodiment is substantially similar to that in the third embodiment. However, the structure of the array substrate in the fourth embodiment is partially different from that in the third embodiment, and the partial view is shown in FIG. 4.

In this embodiment, each poly resistor 403 arranged between the two gate lines 402 may include a first poly resistor 4031, a second poly resistor 4032 and a third poly resistor 4033. The first poly resistor 4031, the second poly resistor 4032 and the third poly resistor 4033 are connected in serial, and then further arranged between the two gate lines 402.

During the normal operation, since the first poly resistor 4031, the second poly resistor 4032 and the third poly resistor 4033 are connected in serial, the resistance may be large with respect to an electrical conduction device in the circuit, and thus it will not affect the normal operation of the panel. That is to say, during the normal operation, the poly resistors 403 will not affect electric potentials between two adjacent gate lines 402. However, once the ESD occurs in at least one row of gate line 402, the poly resistors 403 may play roles of static conductors, in such a way that all the gate lines 402 on the whole panel may together resist the ESD.

Figure 5:
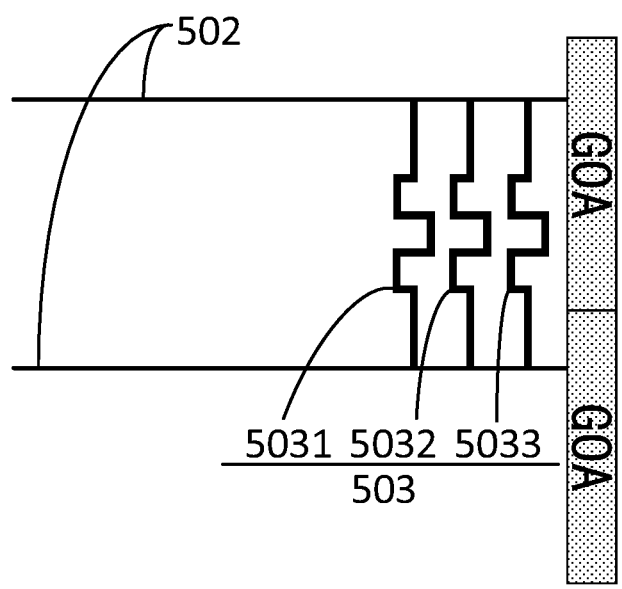
FIG. 5 is a partially structural view of an array substrate according to a fifth embodiment of the present disclosure.

Referring to FIG. 5, a partially structural view of an array substrate according to a fifth embodiment of the present disclosure is depicted in FIG. 5.

The structure of the array substrate in the fifth embodiment is substantially similar to that in the third embodiment. However, the structure of the array substrate in the fifth embodiment is partially different from that in the third embodiment, and the partial view is shown in FIG. 5.

In this embodiment, each poly resistor 503 arranged between the two gate lines 502 may include a first poly resistor 5031, a second poly resistor 5032 and a third poly resistor 5033. The first poly resistor 5031, the second poly resistor 5032 and the third poly resistor 5033 are arranged between the two gate lines 402 in parallel.

During the normal operation, although the first poly resistor 5031, the second poly resistor 5032 and the third poly resistor 5033 are connected in parallel, the resistance may be large with respect to the electrical conduction device in the circuit, and thus it will not affect the normal operation of the panel. That is to say, during the normal operation, the poly resistors 503 will not affect electric potentials between two adjacent gate lines 502. However, once the ESD occurs in at least one row of gate line 502, the poly resistors 503 may play roles of static conductors, in such a way that all the gate lines 502 on the whole panel may together resist the ESD, and thus the anti-electrostatic discharge ability of the array substrate may be improved. Meanwhile, since a plurality of poly resistors are connected in parallel, the static-conducting device of the present disclosure may keep working normally even one of the plurality of poly resistors is damaged, and thus the circuit may be protected.

Compared with the prior art, the poly resistors are arranged among the plurality of gate lines in the present disclosure, in such a way that the plurality of gate lines are electrically connected to each other to together resist the ESD. In this way, it is possible improve the anti-electrostatic discharge ability of the array substrate.

The array substrate of the present disclosure may be applied to a display panel and a display apparatus.

The descriptions above are merely the embodiments of the present disclosure, and are not intended to limit the protection scope of the present disclosure. In fact, one skilled in the art may make many equivalents and modifications based on the specification and the drawings of the present disclosure, or directly or indirectly apply the technical solution to other relevant technical field. All these shall all be covered within the protection of the disclosure.

What is claimed is:

1. An array substrate, comprising:
    a GOA (Gate Driver On Array) unit having two parts distributed at two opposite sides of the array substrate respectively;
    a plurality of gate lines electrically connected to the GOA unit, wherein the gate lines electrically connected to a first part of the GOA unit which is distributed at one of the two opposite sides of the array substrate and the gate lines electrically connected to a second part of the GOA unit which is distributed at the other of the two opposite sides of the array substrate are arranged alternately; and a static-conducting device having a plurality of static-conducting units and electrically connected to the gate lines, in such a way that every two of the gate lines electrically connected to the same part of the GOA unit and being adjacent to each other are connected to each other via one of the plurality of static-conducting units; wherein the static-conducting device is not electrically connected to the GOA unit, and ones of the plurality of static-conducting units connected between ones of the gate lines electrically connected to the same part of the GOA unit are connected in series.

2. The array substrate of claim 1, wherein the static-conducting device comprises a plurality of static-conducting units, and each of the static-conducting units is arranged between two gate lines.

3. The array substrate of claim 2, wherein each of the static-conducting units comprises a TFT having a source electrode, a drain electrode and a gate electrode; the source electrode and the drain electrode of each TFT are connected to two adjacent gate lines respectively; and the gate electrode of each TFT is floated.

4. The array substrate of claim 3, wherein each of the static-conducting units comprises at least two TFTs connected in serial.

5. The array substrate of claim 2, wherein each of the static-conducting units comprises a diode ring, and the diode ring comprises two static-conducting paths configured for respectively conducting positive charges and negative charges.

6. The array substrate of claim 5, wherein each of the static-conducting units comprises at least two diode rings connected in parallel.

7. The array substrate of claim 2, wherein each of the static-conducting units comprises a poly resistor.

8. The array substrate of claim 2, wherein each of the static-conducting units comprises at least two poly resistors connected in parallel.

9. The array substrate of claim 1, wherein the array substrate comprises a non-display area; and the GOA unit and the static-conducting device are both located in the non-display area.

10. The array substrate of claim 1, wherein the GOA unit comprises a plurality of GOA subunits; the plurality of gate lines are electrically connected to each GOA subunit one by one.

11. A display panel, comprising an array substrate; wherein the array substrate comprises:

a GOA (Gate Driver On Array) unit having two parts distributed at two opposite sides of the array substrate respectively;

a plurality of gate lines electrically connected to the GOA unit, wherein the gate lines electrically connected to a first part of the GOA unit which is distributed at one of the two opposite sides of the array substrate and the gate lines electrically connected to a second part of the GOA unit which is distributed at the other of the two opposite sides of the array substrate are arranged alternately; and a static-conducting device having a plurality of static-conducting units and electrically connected to the gate lines, in such a way that every two of the gate lines electrically connected to the same part of the GOA unit and being adjacent to each other are connected to each other via one of the plurality of static-conducting units; wherein the static-conducting device is not electrically connected to the GOA unit, and ones of the plurality of static-conducting units connected between ones of the gate lines electrically connected to the same part of the GOA unit are connected in series.

12. The array substrate of claim 11, wherein the static-conducting device comprises a plurality of static-conducting units, and each of the static-conducting units is arranged between two gate lines.

13. The array substrate of claim 12, wherein each of the static-conducting units comprises a TFT having a source electrode, a drain electrode and a gate electrode; the source electrode and the drain electrode of each TFT are connected to two adjacent gate lines respectively; and the gate electrode of each TFT is floated.

14. The array substrate of claim 13, wherein each of the static-conducting units comprises at least two TFTs connected in serial.

15. The array substrate of claim 12, wherein each of the static-conducting units comprises a diode ring, and the diode ring comprises two static-conducting paths configured for respectively conducting positive charges and negative charges.

16. The array substrate of claim 15, wherein each of the static-conducting units comprises at least two diode rings connected in parallel.

17. The array substrate of claim 12, wherein each of the static-conducting units comprises a poly resistor.

18. The array substrate of claim 12, wherein each of the static-conducting units comprises at least two poly resistors connected in parallel.

19. The array substrate of claim 11, wherein the array substrate comprises a non-display area; and the GOA unit and the static-conducting device are both located in the non-display area.

20. The array substrate of claim 11, wherein the GOA unit comprises a plurality of GOA subunits; the plurality of gate lines are electrically connected to each GOA subunit one by one.

* * * * *